United States Patent
Segawa

(10) Patent No.: US 9,625,831 B1
(45) Date of Patent: Apr. 18, 2017

(54) EXPOSURE APPARATUS, EXPOSURE METHOD AND MANUFACTURING METHOD OF SEMICONDUCTOR DEVICE

(71) Applicant: Kabushiki Kaisha Toshiba, Minato-ku (JP)

(72) Inventor: Kazuhiro Segawa, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/018,950

(22) Filed: Feb. 9, 2016

Related U.S. Application Data

(60) Provisional application No. 62/259,867, filed on Nov. 25, 2015.

(51) Int. Cl.
  *G03B 27/42* (2006.01)
  *G03F 7/20* (2006.01)
  *H01L 21/68* (2006.01)

(52) U.S. Cl.
  CPC ........ *G03F 7/70616* (2013.01); *H01L 21/682* (2013.01)

(58) Field of Classification Search
  CPC ............. G03F 7/70616; G03F 7/70633; G03F 7/70783; G03F 7/705; G03F 7/7085; G03F 7/70483; G03F 9/7003; G03F 9/7011; G03F 9/7034; G03F 7/20; G03F 7/703; G03F 9/7042; G03F 7/3028; G03F 7/70425; G03F 7/7065; G01N 21/956; G01N 21/95607; G01N 2021/09
  See application file for complete search history.

(56) References Cited

U.S. PATENT DOCUMENTS

| | | | |
|---|---|---|---|
| 7,718,327 | B2 | 5/2010 | Okita |
| 8,088,539 | B2 | 1/2012 | Yamanaka |
| 8,111,376 | B2 | 2/2012 | Adel et al. |
| 9,116,442 | B2 | 8/2015 | Adel et al. |
| 2013/0089935 | A1 | 4/2013 | Vukkadala et al. |

FOREIGN PATENT DOCUMENTS

| | | |
|---|---|---|
| JP | 4373564 | 11/2009 |
| JP | 2009-283600 | 12/2009 |
| JP | 2010-529659 | 8/2010 |
| JP | 5194800 | 5/2013 |
| JP | 2014-534631 | 12/2014 |
| JP | 2015-43452 | 3/2015 |

*Primary Examiner* — Mesfin Asfaw
(74) *Attorney, Agent, or Firm* — Oblon, McClelland, Maier & Neustadt, L.L.P.

(57) ABSTRACT

According to one embodiment, a controller calculates wafer alignment residuals from results of wafer alignment measurement and calculates shape change displacement residuals from the surface shape of a wafer. Further, the controller calculates first conversion coefficients that are ratios of the wafer alignment residuals to the shape change displacement residuals and generates fine wafer alignment residual data by using the first conversion coefficients. Furthermore, the controller generates correction information in which first correction values at the time of the exposure processing are calculated for every shot on the wafer by using the fine wafer alignment residual data. Then, the controller controls exposure processing in an exposure unit by using the correction information corresponding to the shot of the wafer.

20 Claims, 9 Drawing Sheets

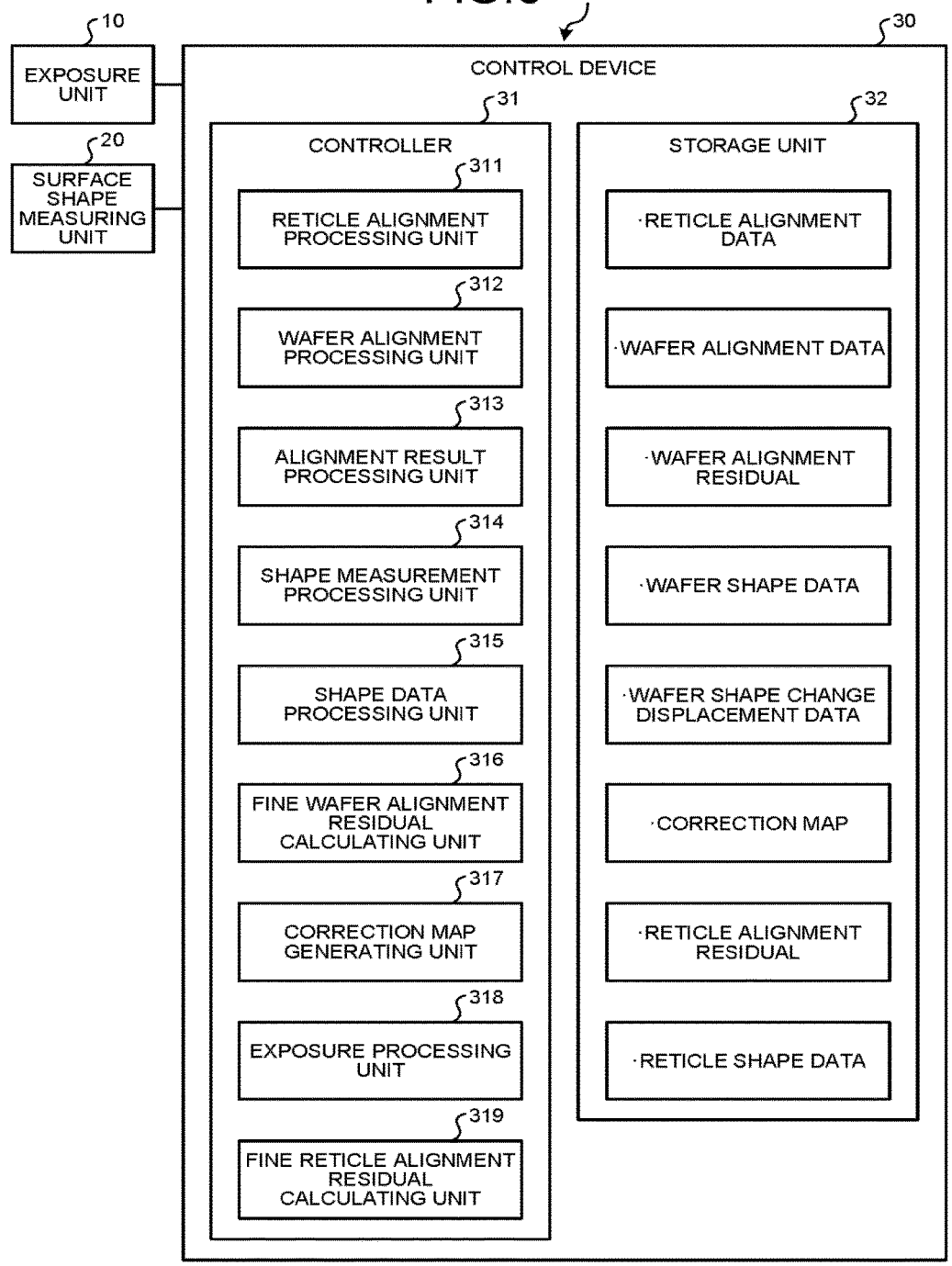

EXPOSURE APPARATUS, EXPOSURE METHOD AND MANUFACTURING METHOD OF SEMICONDUCTOR DEVICE

CROSS-REFERENCE TO RELATED APPLICATIONS

This application is based upon and claims the benefit of priority from U.S. Provisional Application No. 62/259,867, filed on Nov. 25, 2015; the entire contents of which are incorporated herein by reference.

FIELD

Embodiments described herein relate generally to an exposure apparatus, an exposure method, and a method of manufacturing a semiconductor device.

BACKGROUND

In recent years, a semiconductor device has been formed so as to have a fine structure and a stacked structure. As the structure of the semiconductor device becomes fine, overlay accuracy to be required has become high. Further, since distortion is generated in the plane of a wafer due to an influence of film stress caused by stacking, it is difficult to ensure overlay accuracy.

A correction method, which calculates correction values of exposure positions on the basis of results of overlay measurement and feeds the correction values back to an exposure apparatus, is known as a correction method for ensuring overlay accuracy. Further, there is also known a correction method, which calculates an X-direction shape change displacement and a Y-direction shape change displacement from a difference between the measurement results of wafers of lower and upper layers previously measured, calculates correction values of exposure positions on the basis of the X-direction shape change displacement and the Y-direction shape change displacement, and feeds the correction values back to an exposure apparatus.

In a correction method that feeds correction value back to an exposure apparatus, calibration using the results of overlay measurement on results of wafer shape measurement is necessary to improve the correction accuracy. However, when differences are generated between the shapes of wafers to be corrected, overlay measurement of a plurality of wafers needs to be performed. For this reason, load is applied to an overlay measurement apparatus. Further, since calibration using the results of overlay measurement is needed, cycle time, which is required until the calculation of a feedforward correction value, is lengthened. As a result, time is required until a calibrated correction value is reflected.

BRIEF DESCRIPTION OF THE DRAWINGS

FIG. 6 is a block diagram schematically illustrating the configuration of an exposure apparatus according to a second embodiment.

DETAILED DESCRIPTION

According to the embodiment, an exposure apparatus includes a surface shape measuring unit that measures the surface shape of an object to be measured, an exposure unit that performs exposure on a resist applied to a wafer, and a controller that controls the surface shape measuring unit and the exposure unit. The controller measures the surface shape of the wafer to be subjected to exposure processing by the surface shape measuring unit before the exposure processing. Further, the controller performs wafer alignment measurement on the wafer in the exposure unit, and calculates wafer alignment residuals from results of the wafer alignment measurement. Furthermore, the controller calculates shape change displacement residuals from the surface shape of the wafer that is not yet subjected to the exposure processing, and calculates first conversion coefficients that are ratios of the wafer alignment residuals to the shape change displacement residuals. Moreover, the controller converts the shape change displacement residuals of the wafer into fine wafer alignment residuals by use of the first conversion coefficients to generate fine wafer alignment residual data that are the collection of the fine wafer alignment residuals at measurement positions for the surface shape. In addition, the controller generates correction information in which first correction values at the time of the exposure processing are calculated for every shot on the wafer by use of the fine wafer alignment residual data. Further, the controller controls exposure processing in the exposure unit by use of the correction information corresponding to the shot of the wafer.

Exposure apparatuses, exposure methods, and methods of manufacturing a semiconductor device according to embodiments will be described in detail below with reference to accompanying drawings. Meanwhile, the invention is not limited to these embodiments.

First Embodiment

Figure 1:
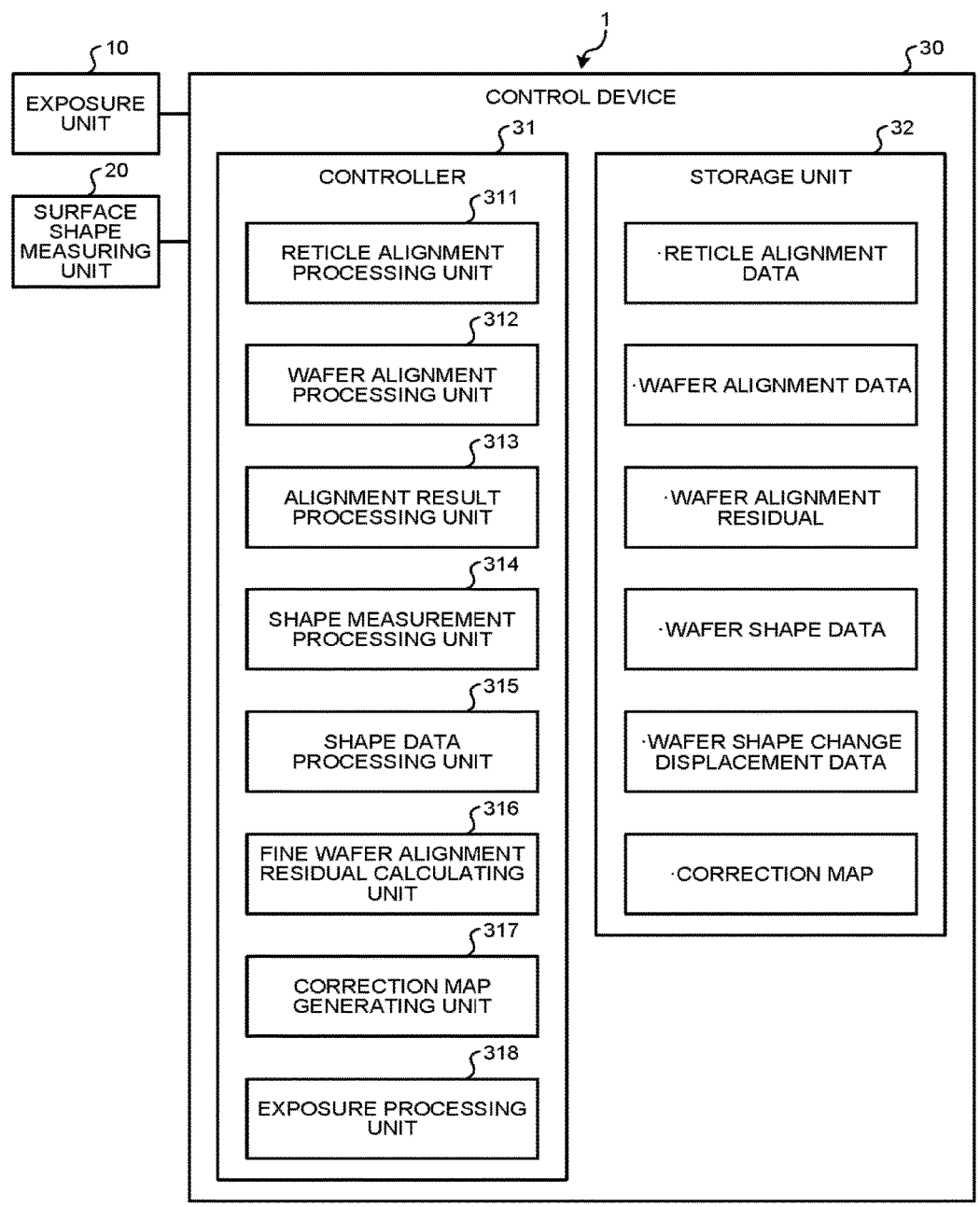
FIG. 1 is a block diagram schematically illustrating an example of the configuration of an exposure apparatus according to a first embodiment.
Figure 2:
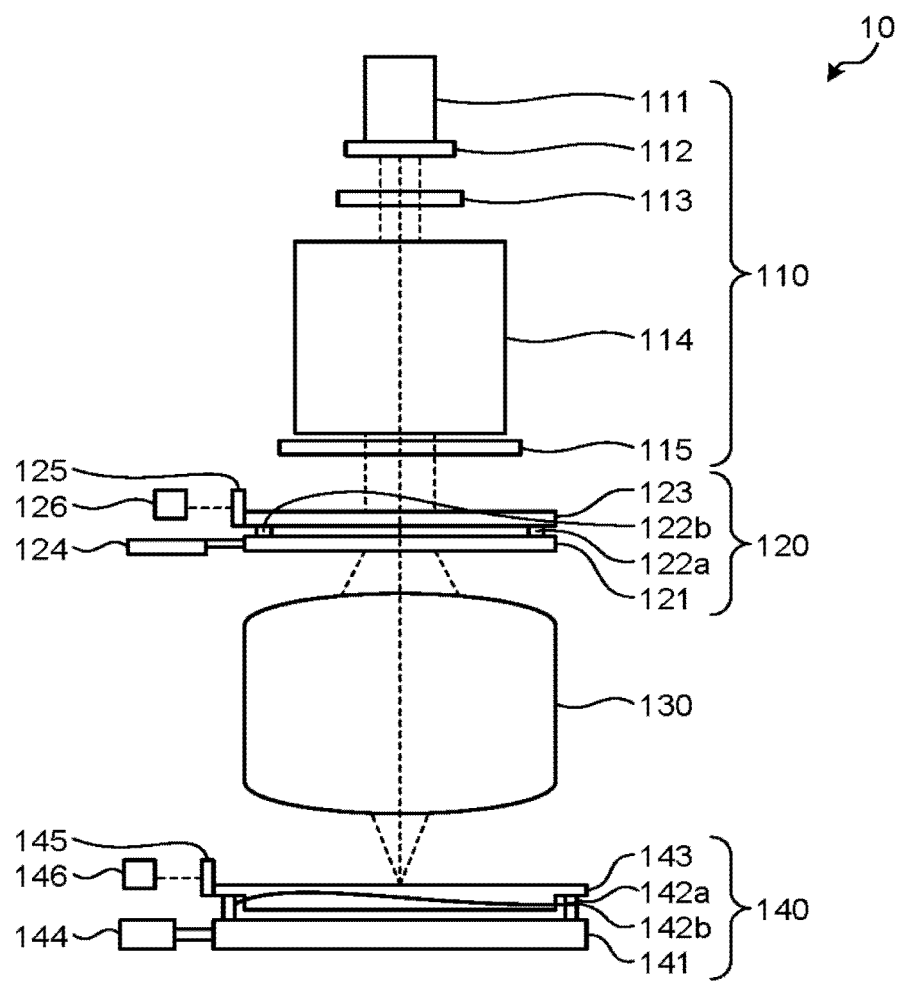
FIG. 2 is a diagram schematically illustrating an example of the structure of an exposure unit of the first embodiment.

FIG. 1 is a block diagram schematically illustrating an example of the configuration of an exposure apparatus according to a first embodiment, and FIG. 2 is a diagram schematically illustrating an example of the structure of an exposure unit of the first embodiment. The exposure apparatus 1 includes an exposure unit 10, a surface shape measuring unit 20, and a control device 30.

The exposure unit 10 includes an illumination optical system 110, a reticle stage 120, a projection optical system 130, and a wafer stage 140. The illumination optical system 110 includes an illumination light source ill, an aperture stop holder 112, a polarizer 113, a condensing optical system 114, and a slit holder 115. The illumination light source 111 emits illumination light such as an argon fluoride laser beam having a wavelength of, for example, 193 nm. The aperture stop holder 112 is disposed below the illumination light source 111. The polarizer 113 polarizes the illumination light emitted from the illumination light source 111. The condensing optical system 114 concentrates the illumination light. The slit holder 115 is disposed below the condensing optical system 114. A polarizer adjusting mechanism (not illustrated) is connected to the polarizer 113. The polarizer adjusting mechanism adjusts the position of the polarizer 113 to adjust the polarization direction of the illumination light.

The reticle stage 120 is disposed below the illumination optical system 110. The reticle stage 120 includes an X-Y stage 121 for a reticle, movable shafts 122a and 122b for a reticle that are disposed on the X-Y stage 121 for a reticle, and a Z-tilt stage 123 for a reticle that is connected to the X-Y stage 121 for a reticle by the respective movable shafts 122a and 122b for a reticle. A reticle stage driving unit 124 is connected to the reticle stage 120. The reticle stage driving unit 124 scans the X-Y stage 121 for a reticle in a horizontal direction. Further, the reticle stage driving unit 124 drives the respective movable shafts 122a and 122b for a reticle in a vertical direction. Accordingly, the Z-tilt stage 123 for a reticle is positioned in the horizontal direction by the X-Y stage 121 for a reticle, and can be disposed so as to be tilted with respect to a horizontal plane by the respective movable shafts 122a and 122b for a reticle. A moving mirror 125 for a reticle is disposed at an end portion of the Z-tilt stage 123 for a reticle. The position of the Z-tilt stage 123 for a reticle is measured by a laser interferometer 126 for a reticle that is disposed so as to face the moving mirror 125 for a reticle.

The projection optical system 130 is disposed below the reticle stage 120. The projection optical system 130 includes a plurality of lens elements (not illustrated). Here, lens driving units (not illustrated), such as piezoelectric elements, are connected to the lens elements. Each of the lens driving units is independently controlled by a driving voltage to be applied, and tilts the lens element with respect to a plane, which is perpendicular to an optical axis, by an arbitrary angle or moves the lens element in a direction of the optical axis.

The wafer stage 140 is disposed below the projection optical system 130. The wafer stage 140 includes an X-Y stage 141 for a wafer, movable shafts 142a and 142b for a wafer that are disposed on the X-Y stage 141 for a wafer, and a Z-tilt stage 143 for a wafer that is connected to the X-Y stage 141 for a wafer by the respective movable shafts 142a and 142b for a wafer. A wafer stage driving unit 144 is connected to the wafer stage 140. The wafer stage driving unit 144 scans the X-Y stage 141 for a wafer in a horizontal direction. Further, the wafer stage driving unit 144 drives the respective movable shafts 142a and 142b for a wafer in a vertical direction. Accordingly, the Z-tilt stage 143 for a wafer is positioned in the horizontal direction by the X-Y stage 141 for a wafer, and can be disposed so as to be tilted with respect to a horizontal plane by the respective movable shafts 142a and 142b for a wafer. A moving mirror 145 for a wafer is disposed at an end portion of the Z-tilt stage 143 for a wafer. The position of the Z-tilt stage 143 for a wafer is measured by a laser interferometer 146 for a wafer that is disposed so as to face the moving mirror 145 for a wafer.

The surface shape measuring unit 20 is a unit that measures the surface shapes of a wafer and a reticle. A measuring unit, which uses a capacitive sensor, or the like can be used as the surface shape measuring unit 20.

The control device 30 controls the exposure apparatus 1 according to a recipe. The control device 30 includes a controller 31 and a storage unit 32. The controller 31 includes a reticle alignment processing unit 311, a wafer alignment processing unit 312, an alignment result processing unit 313, a shape measurement processing unit 314, a shape data processing unit 315, a fine wafer alignment residual calculating unit 316, a correction map generating unit 317, and an exposure processing unit 318. The controller 31 includes one or a plurality of CPUs (Central Processing Unit) and a peripheral circuit. Further, the reticle alignment processing unit 311, the wafer alignment processing unit 312, the alignment result processing unit 313, the shape measurement processing unit 314, the shape data processing unit 315, the fine wafer alignment residual calculating unit 316, the correction map generating unit 317, and the exposure processing unit 318 are realized when the CPU executes a program.

The reticle alignment processing unit 311 performs reticle alignment processing before exposure processing. In the reticle alignment processing, displacement of a reticle, which corresponds to a layer to be exposed from now, from a reference position is measured by a reticle alignment microscope (not illustrated). Reticle alignment data, which are obtained in this way, are stored in the storage unit 32 in association with layers subjected to exposure processing.

The wafer alignment processing unit 312 performs wafer alignment processing before exposure processing. In the wafer alignment processing, displacement of a layer, which is to be exposed from now, from a reference position is measured by a wafer alignment microscope (not illustrated). Wafer alignment data, which are obtained in this way, are stored in the storage unit 32 in association with layers subjected to exposure processing. The measurement of displacement is performed at certain inspection positions on a wafer.

The alignment result processing unit 313 performs correction for removing errors from the obtained wafer alignment data by using a certain function. Hereinafter, wafer alignment data having been corrected are referred to as corrected wafer alignment data. Further, the alignment result processing unit 313 calculates wafer alignment residuals that are differences between the wafer alignment data and the corrected wafer alignment data. The wafer alignment residuals are calculated at positions where wafer alignment measurement is performed. The wafer alignment residuals are stored in the storage unit 32 in association with layers subjected to exposure processing.

Before the exposure processing, the shape measurement processing unit 314 measures the shape of a wafer by using the surface shape measuring unit 20. The shape measurement processing unit 314 stores wafer shape data in the storage unit 32 in association with layers subjected to exposure processing. Meanwhile, all wafers of one lot may be subjected to measurement, and a certain number of wafers of one lot may be subjected to measurement.

The shape data processing unit 315 calculates changes of the shape of a wafer to be subjected to exposure processing, and calculates a shape change displacement at each position on the wafer on the basis of the change of the shape of the wafer. Specifically, the shape data processing unit 315 reads the wafer shape data of a layer, which is to be subjected to exposure processing from now, and the wafer shape data of a layer that has been subjected to immediately preceding exposure processing, from the storage unit 32; and calculates wafer shape changes, that is, differences between the wafer shape data of the layer, which is to be subjected to exposure processing from now, and the wafer shape data of the layer that has been subjected to immediately preceding exposure processing. Then, the shape data processing unit 315 obtains shape change displacements at points where shape measurement has been performed on the wafer, from the wafer shape changes. The wafer shape change displacement is a function that represents a height Z at each position (X,Y) on a wafer. For this reason, a wafer shape change displacement in an X direction, which is obtained from the partial differentiation of a height Z with respect to X, and a wafer shape change displacement in a Y direction, which is obtained from the partial differentiation of a height Z with respect to Y, are actually obtained.

Further, the shape data processing unit 315 performs correction for removing errors from the calculated wafer shape change displacements by using a certain function. For example, when there is a curved portion, a component, is taken to suck and align a wafer, is removed by correction using a certain function. Hereinafter, wafer shape change displacements having been corrected are referred to as corrected wafer shape change displacements.

Furthermore, the shape data processing unit 315 calculates shape change displacement residual data. The shape change displacement residual data are obtained from the calculation of shape change displacement residuals, which are differences between wafer shape change displacements and corrected wafer shape change displacements, at all of points where shape measurement has been performed on the wafer.

The fine wafer alignment residual calculating unit 316 calculates a conversion coefficient that is a ratio of the wafer alignment residual to the shape change displacement residual, and converts the shape change displacement residual data into wafer alignment residual data of the entire wafer (hereinafter, referred to as fine wafer alignment residual data) by using the conversion coefficient.

Specifically, the fine wafer alignment residual calculating unit 316 acquires shape change displacement residuals at positions where wafer alignment residuals are acquired, and acquires combinations of (the wafer alignment residuals and the shape change displacement residuals) at the respective positions. Then, the fine wafer alignment residual calculating unit 316 obtains a correlation between the wafer alignment residuals and the shape change displacement residuals by using the acquired combinations of (the wafer alignment residuals and the shape change displacement residuals). For example, the fine wafer alignment residual calculating unit 316 plots the combinations of (the wafer alignment residuals, the shape change displacement residuals) in a coordinate system of which a horizontal axis represents a shape change displacement residual and a vertical axis represents a wafer alignment residual. After that, the fine wafer alignment residual calculating unit 316 obtains an approximate straight line (an approximate curve of first order) by using a least-squares method. Then, the fine wafer alignment residual calculating unit 316 acquires the gradient of the obtained approximate straight line as a conversion coefficient.

Further, the fine wafer alignment residual calculating unit 316 multiplies a value of each point of the shape change displacement residual data by the conversion coefficient to convert the shape change displacement residual data into the fine wafer alignment residual data. The conversion coefficient, which is obtained by the fine wafer alignment residual calculating unit 316, means a ratio of the wafer alignment residual to the shape change displacement residual at the position where the wafer alignment residual is obtained. For this reason, the fine wafer alignment residual calculating unit 316 can multiply all of the shape change displacement residuals on the wafer by this displacement to convert the shape change displacement residuals into the wafer alignment residuals.

The correction map generating unit 317 calculates correction values (CPE) for every shot by using fine wafer alignment residual data, and generates a correction map that is correction information. The correction map is stored in the storage unit 32 in association with layers. In the calculation of the correction values, the correction map generating unit 317 perform correction in each shot by using, for example, by using Equations (1-1) and (1-2) or Equations (2-1) and (2-2) to be described below.

$$dx = k_1 + k_3 x + k_5 y \tag{1-1}$$

$$dy = k_2 + k_4 y + k_6 x \tag{1-2}$$

$$dx = k_1 + k_3 x + k_5 y + k_7 x^2 + k_{11} y^2 + k_{13} x^3 + k_{19} y^3 \tag{2-1}$$

$$dy = k_2 + k_4 y + k_6 x + k_8 y^2 + k_{10} y x + k_{12} x^2 + k_{14} y^3 + k_{16} y^2 x \tag{2-2}$$

Here, dx means the amount of displacement of an X-direction component in the shot, and dy means the amount of displacement of a Y-direction component in the shot. Further, x means an X-coordinate in the shot, and y means a Y-coordinate in the shot.

Equations (1-1) and (1-2) include zero-order terms and first-order components. The zero-order terms include a parameter $k_1$ that corrects an X-direction shift component and a parameter $k_2$ that is used to correct a Y-direction shift component. The first-order components include a parameter $k_3$ that corrects an X-direction magnification component, a parameter $k_4$ that is used to correct a Y-direction magnification component, and parameters $k_5$ and $k_6$ that are used to correct a rotational component and an orthogonal component.

Further, Equations (2-1) and (2-2) include parameters $k_7$, $k_8$, $k_{10}$ to $k_{14}$, $k_{16}$, and $k_{19}$, which are second-order components and third-order components, in addition to these parameters $k_1$ to $k_6$. $k_7$ is a parameter that is used to drive an aberration correcting mechanism in the X direction parallel to a slit direction to perform correction. $k_{12}$ is a parameter that is used to drive the aberration correcting mechanism in the Y direction parallel to a scanning direction to perform correction. $k_{13}$ is a parameter that is used to drive the aberration correcting mechanism to the upper and lower sides of a wafer to perform correction. $k_8$, $k_{10}$, $k_{11}$, $k_{14}$, $k_{16}$, and $k_{19}$ are parameters that are used to drive the reticle stage 120 to perform correction. Meanwhile, Equations (1-1) to (2-2) are illustrative. As long as being correction calculating equations that can be corrected in the exposure apparatus, arbitrary equations can be used as Equations (1-1) to (2-2).

Parameters $k_n$ (n=1 to 8, 10 to 14, 16, and 19), which represent errors of Equations (1-1) and (1-2) or Equations (2-1) and (2-2), are calculated for every shot by fitting using a least-squares method, so that correction parameters in the shots are obtained. The obtained correction parameters are stored in the storage unit 32 for every shot.

When exposure is performed by the exposure unit 10, the exposure processing unit 318 reads correction parameters from the correction map for every shot and applies the read correction parameters to the exposure unit 10.

Meanwhile, the number of measurement points for wafer alignment data on the wafer is, for example, 20. On the other hand, the number of measurement points for surface shape data in one shot is, for example, 99. When the number of shots performed on the wafer is 100, the number of measurement points for surface shape data on the wafer is 9900. As described above, it may be considered that the number of measurement points for surface shape data covers substantially the entire wafer. For this reason, in the first embodiment, a correlation between the wafer alignment residuals and the shape change displacement residuals is obtained, and the shape change displacement residuals for which the number of measurement points is large are converted into the wafer alignment residuals by using conversion coefficients. Accordingly, even in an area where wafer alignment measurement is not performed, correction parameters can be calculated by using the calibrated shape change displacement residual data, that is, the converted fine wafer alignment residual data.

The storage unit 32 stores results that are calculated by the controller 31 as described above. For example, the reticle alignment data, the wafer alignment data, the wafer alignment residuals, the wafer shape data, wafer shape change displacement data, and the correction map are stored in the storage unit 32.

Figure 3:
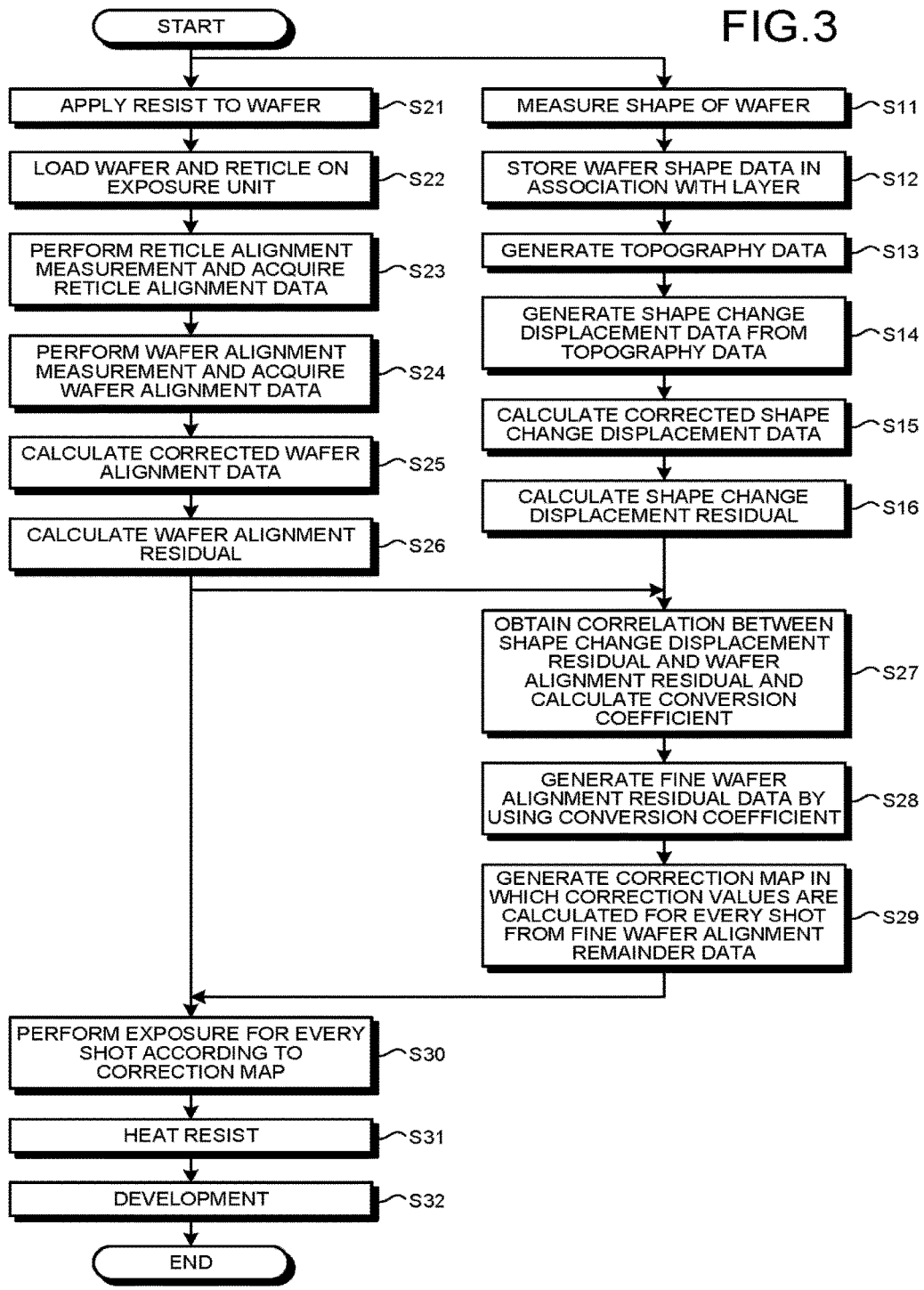
FIG. 3 is a flowchart illustrating an example of a procedure of a method of manufacturing a semiconductor device according to the first embodiment.

Next, a method of manufacturing a semiconductor device, which includes an exposure method performed in the exposure apparatus 1 having this configuration, will be described. FIG. 3 is a flowchart illustrating an example of a procedure of the method of manufacturing a semiconductor device according to the first embodiment. FIGS. 4A to 4E are diagrams schematically illustrating examples of the outline of correction processing of an exposure method according to the first embodiment.

First, the shape measurement processing unit 314 of the controller 31 gives an instruction to the surface shape measuring unit 20 so that the surface shape measuring unit 20 measures the shape of a wafer of a lot to be exposed, and the surface shape measuring unit 20 measures the shape of the wafer according to the instruction (Step S11). It is preferable that shape measurement is performed at a plurality of points, of which the number is larger than the number of measurement points for wafer alignment, in all shot areas provided on the wafer. All wafers of the lot may be subjected to shape measurement, and a certain number of wafers of the lot may be subjected to shape measurement. For example, if all of the wafers are deformed in the same manner in manufacturing steps, not all of the wafers need to be subjected to shape measurement. Measurement results are stored in the storage unit 32 as wafer shape data in association with layers (Step S12).

Then, the shape data processing unit 315 of the controller 31 generates topography data (Step S13). Specifically, the shape data processing unit 315 reads wafer shape data that are measured in Step S11 and wafer shape data that are stored in the storage unit 32 at the time of the preceding exposure processing for the same wafers. Alternatively, when only a certain number of wafers of the lot are subjected to wafer shape measurement, the shape data processing unit 315 reads the wafer shape data, which are measured in Step S11, of the same lot as the lot of the wafers to be processed and wafer shape data that are stored in the storage unit 32 at the time of the preceding exposure processing for the wafers of the same lot. Then, the shape data processing unit 315 takes differences between the wafer shape data, which are measured in this time, and wafer shape data, which are obtained at the time of the preceding processing, at measurement positions to generate topography data. The topography data are represented by a three-dimensional function that includes variables X, Y, and Z.

After that, the shape data processing unit 315 calculates shape change displacements at the respective measurement positions from the topography data, and generates shape change displacement data that represent the shape change displacements of the entire wafer (Step S14). Specifically, shape change displacements at a position (X,Y) on the wafer are obtained from the partial differentiation of the function, which represents the topography data, with respect to X and Y. Further, the collection of the shape change displacements at the respective measurement positions on the wafer is shape change displacement data.

Then, the shape data processing unit 315 corrects the shape change displacement data, which are acquired in Step S14, to calculate corrected shape change displacement data (Step S15). This calculation is the removal of errors from the shape change displacement data. A preset function is used for the removal of the errors.

Figure 4A:
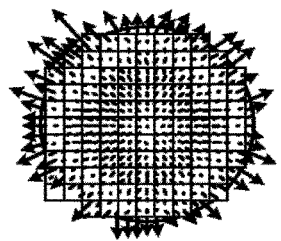
FIGS. 4A to 4E are diagrams schematically illustrating an example of the outline of correction processing of an exposure method according to the first embodiment.

In addition, the shape data processing unit 315 calculates shape change displacement residuals (Step S16). The shape change displacement residuals are differences between the corrected shape change displacement data and the shape change displacement data at the respective measurement positions. FIG. 4A is a diagram illustrating an example of the shape change displacement residuals. In the example of FIG. 4A, the shape change displacement residual at each measurement point is represented by a vector. It is preferable that the processing of Steps S11 and S12 of the above-mentioned processing is performed, for example, before the exposure processing for a lot to be exposed.

A resist is applied to the wafer of the lot to be subjected to exposure processing in parallel with the processing of Steps S13 to S16 (Step S21). After that, the wafer to which the resist has been applied and a reticle, which is used for the wafer, are loaded on the exposure unit 10 (Step S22).

Then, the reticle alignment processing unit 311 of the controller 31 performs reticle alignment measurement in the exposure unit 10 and acquires reticle alignment data (Step S23). In the reticle alignment measurement, displacement of the loaded reticle from the reference position is measured. After that, the wafer alignment processing unit 312 of the controller 31 performs wafer alignment measurement in the exposure unit 10 and acquires wafer alignment data (Step S24). In the wafer alignment measurement, displacement of a layer, which is to be exposed from now, from the reference position is measured on the wafer. The number of measurement positions in wafer alignment is very smaller than the number of measurement positions in the wafer shape measurement in Step S11, and is, for example, several tens.

After that, the alignment result processing unit 313 of the controller 31 corrects the wafer alignment data acquired in Step S24 to calculate corrected wafer alignment data (Step S25). This calculation is the removal of errors from the wafer alignment data. A preset function is used for the removal of the errors.

Figure 4B:
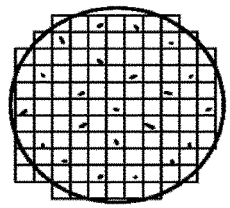

Then, the alignment result processing unit 313 calculates wafer alignment residuals (Step S26). The wafer alignment residuals are differences between the corrected wafer alignment data and the wafer alignment data at the respective measurement positions. At the time of the exposure processing, correction is performed on the basis of the wafer alignment residuals. FIG. 4B is a diagram illustrating an example of the wafer alignment residuals. In the example of FIG. 4B, the wafer alignment residual at each measurement point is represented by a vector. Further, the number of measurement positions in FIG. 4B is very smaller than that in FIG. 4A.

Figure 4C:
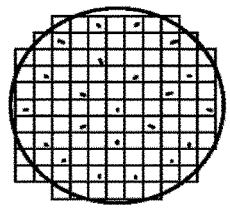

After that, the fine wafer alignment residual calculating unit 316 of the controller 31 obtains a correlation between the shape change displacement residuals and the wafer alignment residuals and calculates conversion coefficients (Step S27). Specifically, the fine wafer alignment residual calculating unit 316 acquires shape change displacement residuals at the measurement positions for wafer alignment residuals. FIG. 4C illustrates shape change displacement residuals at the same position as the positions where the wafer alignment residuals are measured. Then, the fine wafer alignment residual calculating unit 316 acquires combinations of the wafer alignment residuals and the shape change displacement residuals at the respective measurement positions.

Figure 4D:
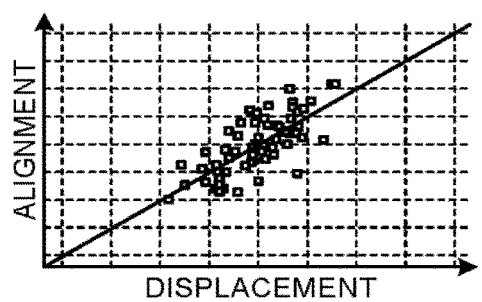

After that, the fine wafer alignment residual calculating unit 316 plots the acquired combinations in a coordinate system of which a horizontal axis represents a shape change displacement residual and a vertical axis represents a wafer alignment residual and obtains a correlation. Meanwhile, since the wafer alignment residuals and the shape change displacement residuals are vectors as described above, the fine wafer alignment residual calculating unit 316 resolves each of the wafer alignment residuals and the shape change displacement residuals into an X-direction component and a Y-direction component and obtains a correlation of each component. FIG. 4D is a diagram illustrating an example of a relationship between the wafer alignment residuals and the shape change displacement residuals. As illustrated in FIG. 4D, the fine wafer alignment residual calculating unit 316 calculates an approximate straight line from plotted points by using a least-squares method, and calculates the displacement of the approximate straight line in the X direction and the Y direction. Then, this gradient is a conversion coefficient. Meanwhile, when there is a point extremely distant from the approximate straight line, the fine wafer alignment residual calculating unit 316 may remove this point to calculate the gradient of the approximate straight line having a high correlation coefficient. Further, the approximate straight line is obtained here, but is illustrative. The plotted points may be approximated with a non-linear curve, for example, a quadratic curve, a cubic curve, or the like. In this case, the gradient of the non-linear curve at each point of the wafer alignment residuals is a conversion coefficient.

Figure 4E:
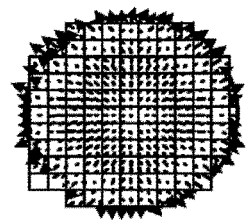

Then, the fine wafer alignment residual calculating unit 316 calibrates the shape change displacement residuals by using conversion coefficients and converts the calibrated shape change displacement residuals into fine wafer alignment residuals (Step S28). For example, the fine wafer alignment residual calculating unit 316 calibrates the shape change displacement residuals of FIG. 4A by using the conversion coefficients calculated in Step S27, and generates fine wafer alignment residuals illustrated in FIG. 4E. More specifically, the fine wafer alignment residual calculating unit 316 multiplies an X-direction component of the shape change displacement residual, which corresponds to the measurement position of FIG. 4A, by an X-direction conversion coefficient; and multiplies a Y-direction component thereof by a Y-direction conversion coefficient. Then, the fine wafer alignment residual calculating unit 316 combines the X-direction component, which is multiplied by the conversion coefficient, with the Y-direction component, which is multiplied by the conversion coefficient, to generate a vector. The fine wafer alignment residual calculating unit 316 performs this processing at all positions where a wafer shape change is measured. As a result, wafer alignment residual data, which have been present at twenty-two points in FIG. 4B, are converted into fine wafer alignment residual data that are present at ten thousand points similar to the case of the shape change displacement residuals as illustrated in FIG. 4E.

After that, the correction map generating unit 317 of the controller 31 generates a correction map, in which correction values are calculated for every shot, by using the fine wafer alignment residual data (Step S29). In this case, the correction map generating unit 317 calculates correction parameters for every shot by using the above-mentioned equations (1-1) and (1-2) or equations (2-1) and (2-2). Meanwhile, when the lower layer of a layer as a current object is corrected by the same procedure and is exposed, a correction value of the lower layer is subtracted from a calculated correction value.

Then, the exposure processing unit 318 of the controller 31 performs the exposure processing of the exposure unit 10 (Step S30). In this case, the exposure processing unit 318 acquires a correction value, which corresponds to a shot for performing exposure processing, from the correction map, and corrects the exposure unit 10 with the correction value. That is, the exposure processing unit 318 performs the feedforward control of the exposure processing for a wafer, which has been subjected to wafer alignment measurement, by using the shape change displacement residuals that are calibrated by using the wafer alignment residuals.

When the exposure processing for every shot ends, the exposed resist is heated to a certain temperature (Step S31) and development processing is performed (Step S32). Accordingly, a resist pattern is formed. After that, while the resist pattern is used as a mask, etching processing for a film to be processed is performed. The method of manufacturing a semiconductor device ends through the above-mentioned processing.

Meanwhile, the processing of the above-mentioned steps S25 to S29 is performed between the wafer alignment measurement of Step S24 and the exposure processing of Step 330. Generally, time, which is required between the wafer alignment measurement and the exposure processing, is about several seconds. A controller 31, which has processing performance for allowing the arithmetic processing of Steps S25 to S29 to be performed for the time, is used.

Figure 5A:
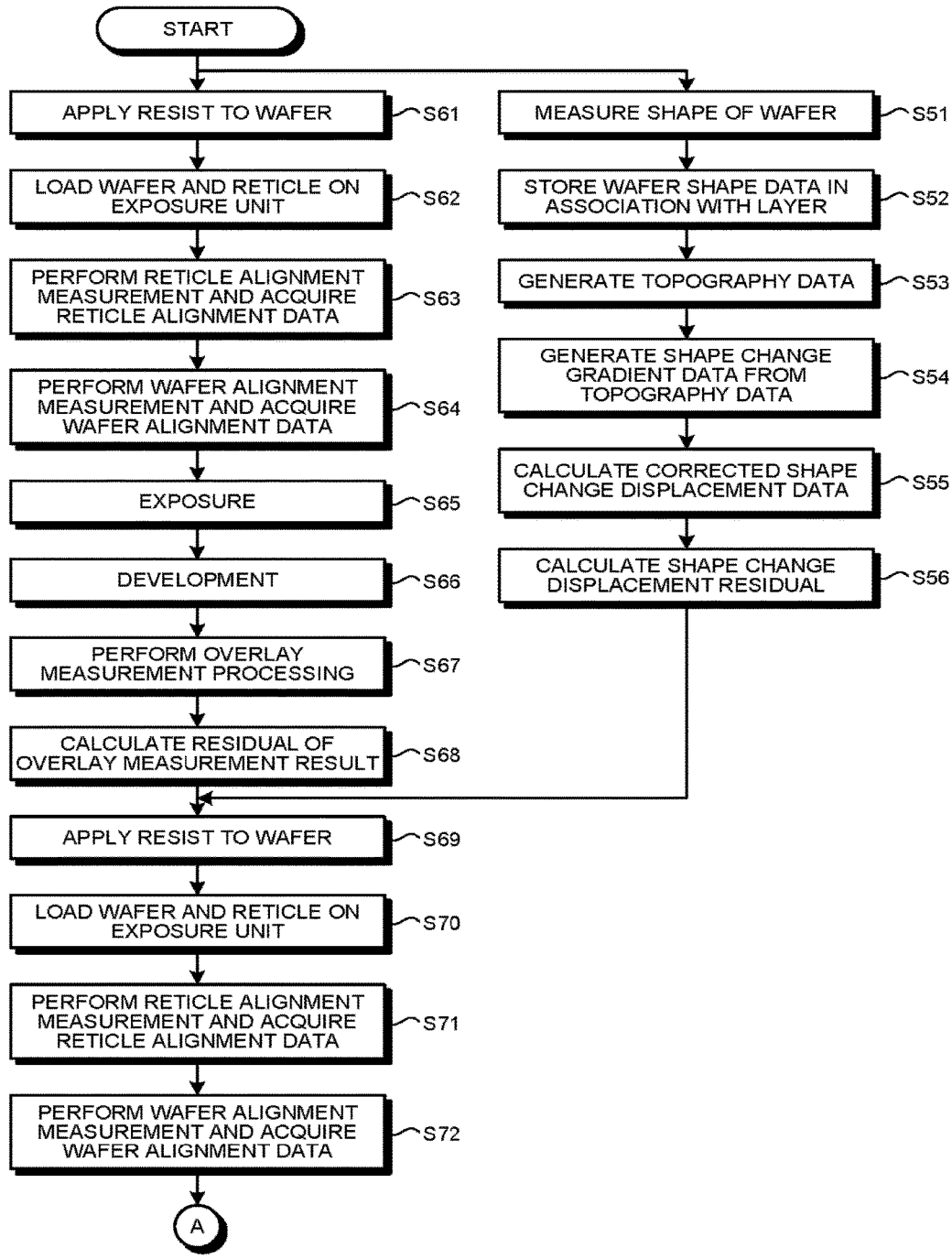
FIGS. 5A and 5B are flowcharts illustrating an example of a procedure of exposure processing according to a comparative example.
Figure 5B:
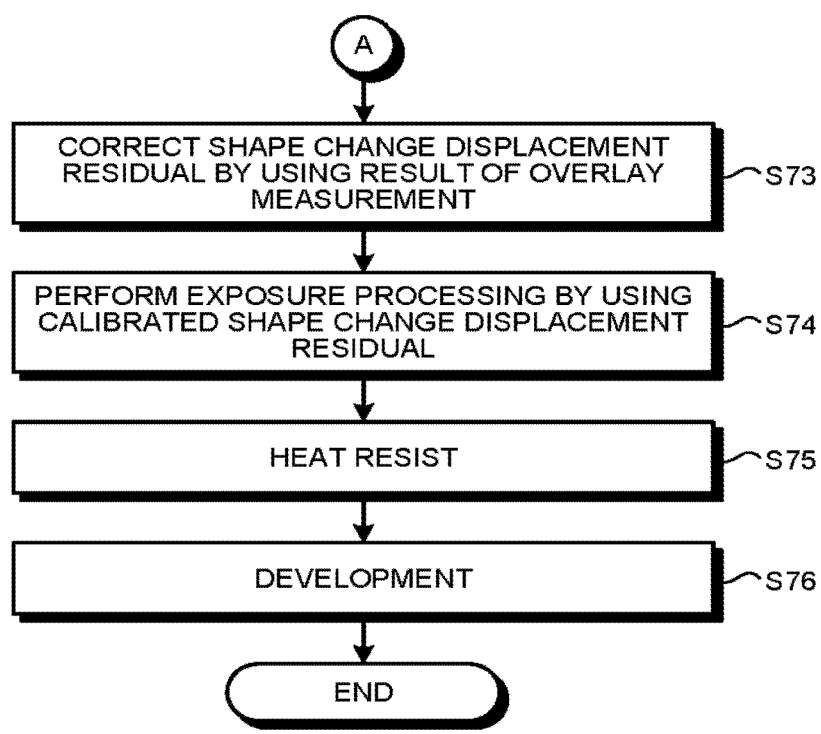

FIGS. 5A and 5B are flowcharts illustrating an example of a procedure of exposure processing according to a comparative example. In the same procedure as the procedure of Steps S11 to S16 of FIG. 3 of the first embodiment, the shape of a wafer to be exposed is measured and shape change displacement residuals are calculated (Steps S51 to S56). Further, as in Steps S21 to S24 of FIG. 3, a resist is applied to the wafer to be exposed, a reticle and the wafer are loaded on the exposure unit 10, and wafer alignment measurement is then performed (Steps S61 to S64).

After that, exposure processing is performed (Step S65), and the exposed resist is heated to a certain temperature and development processing is performed (Step S66). Then, overlay measurement processing is performed on the developed wafer (Step S67). After that, residuals of overlay measurement results are obtained (Step S68), and shape change displacement residuals are calibrated by using the overlay measurement results (Step S69).

Then, as in Steps S61 to S64, a resist is applied to another wafer to be exposed, a reticle and the wafer are loaded on the exposure unit 10, and reticle alignment measurement and wafer alignment measurement are then performed (Steps S69 to S72). After that, the feedforward control of exposure processing is performed by using the calibrated shape change displacement residuals (Step S74). Then, the resist of the exposed wafer is heated (Step S75), and development is performed (Step S76). The method of manufacturing a semiconductor device ends through the above-mentioned processing.

In the method, the overlay measurement of a plurality of wafers needs to be performed when differences are generated between the shapes of wafers to be corrected. Since the overlay measurement generally requires time unlike the wafer shape measurement, load is applied to an overlay measurement apparatus. Further, when time is required for overlay measurement, cycle time is lengthened until the calculation of a correction value used to perform feedforward control. For this reason, time is required until a calibrated correction value is reflected.

In the first embodiment, the shape of a wafer of a lot to be exposed is previously measured to calculate shape change displacement residuals. Then, wafer alignment measurement is performed and wafer alignment residuals are calculated by using the results of the wafer alignment measurement. The gradient of an approximate straight line between the shape change displacement residuals and the wafer alignment residuals is obtained, and the shape change displacement residuals are converted into fine wafer alignment residuals by using the gradient. After that, a correction map in which correction values at the time of exposure processing for every shot are obtained is generated by using the fine wafer alignment residuals, and the exposure unit 10 is corrected by using the correction values of the correction map at the time of exposure processing. Accordingly, it is possible to perform correction with higher accuracy without performing overlay measurement. Further, since it is not necessary to calculate correction values by using the results of overlay measurement, an effect of shortening cycle time is obtained. Furthermore, even though overlay measurement is required, the number of times of overlay measurement can be significantly reduced. For this reason, load applied to the overlay measurement apparatus can be reduced.

Second Embodiment

In the first embodiment, a correction map has been generated using wafer alignment residuals and shape change displacement residuals. A case in which a correction map is generated by further using information obtained from reticle alignment data will be described in a second embodiment.

FIG. 6 is a block diagram schematically illustrating the configuration of an exposure apparatus according to the second embodiment. The exposure apparatus according to the second embodiment further includes a fine reticle alignment residual calculating unit 319 in the controller 31 of the control device 30 of the exposure apparatus 1 according to the first embodiment. The fine reticle alignment residual calculating unit 319 obtains an approximate straight line of reticle alignment residuals with respect to shape change displacement residuals, and acquires a conversion coefficient that is the gradient of the approximate straight line. The fine reticle alignment residual calculating unit 319 multiplies the shape change displacement residuals at measurement positions on a reticle by the conversion coefficient to convert shape change displacement residual data into reticle alignment residual data. Since processing in the fine reticle alignment residual calculating unit 319 is the same as the processing in the fine wafer alignment residual calculating unit 316, the detailed description thereof will be omitted. Meanwhile, the fine reticle alignment residual calculating unit 319 is realized when the CPU executes a program.

Further, in the second embodiment, the functions of the alignment result processing unit 313, the shape measurement processing unit 314, the shape data processing unit 315, and the correction map generating unit 317 are different from those of the first embodiment.

The alignment result processing unit 313 calculates reticle alignment residuals from reticle alignment data in addition to processing for calculating wafer alignment residuals from wafer alignment data. Since the processing for calculating the reticle alignment residuals is the same as the processing for calculating the wafer alignment residuals, the description thereof will be omitted.

The shape measurement processing unit 314 also measures the surface shape of the reticle in addition to the surface shape of a wafer that is used in exposure processing, before the exposure processing.

The shape data processing unit 315 calculates reticle shape change displacement data from reticle shape data in addition to the processing for calculating wafer shape change displacement data from wafer shape data. Since the processing for calculating the reticle shape change displacement data is the same as the processing for calculating the wafer shape change displacement data, the description thereof will be omitted.

The correction map generating unit 317 generates a correction map, in which correction values are calculated for every shot, by using calibrated shape change displacement residuals of a wafer and calibrated shape change displacement residuals of a reticle. That is, when correction values are calculated for every shot, high-order distortion in a shot, which is calculated from the shape of the reticle, is corrected.

Further, the reticle alignment residuals and reticle shape measurement results are further stored in the storage unit 32. These data are stored in association with layers to be subjected to exposure processing.

Meanwhile, since other components are the same as those described in the first embodiment, the description thereof will be omitted.

Figure 7:
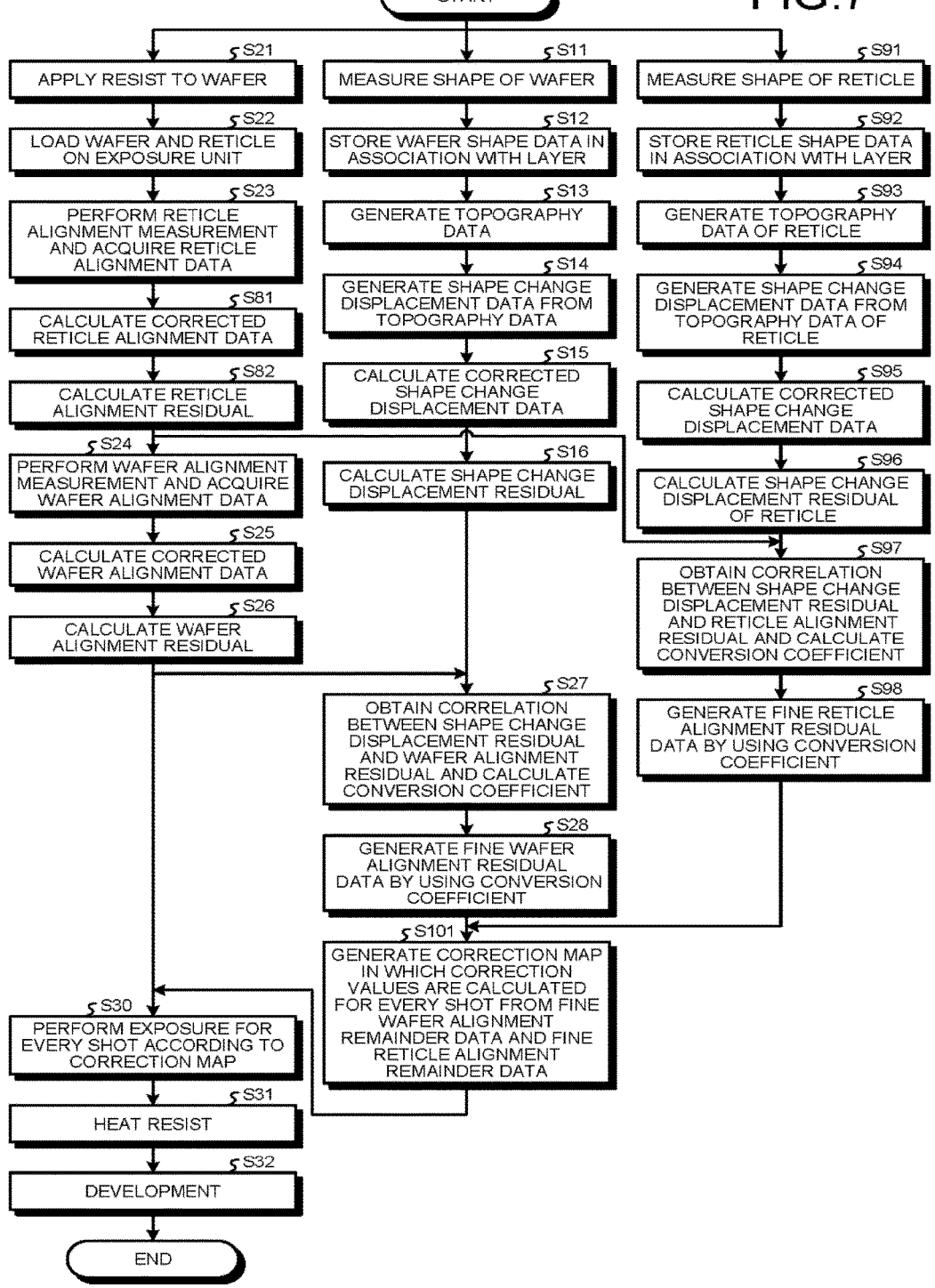
FIG. 7 is a flowchart illustrating an example of a procedure of a method of manufacturing a semiconductor device according to the second embodiment.

FIG. 7 is a flowchart illustrating an example of a procedure of a method of manufacturing a semiconductor device according to the second embodiment. In FIG. 7, processing of second embodiment is added to the flowchart illustrated in FIG. 3 of the first embodiment. For this reason, the description of the same steps as the steps of the first embodiment will be omitted.

In the second embodiment, after the reticle alignment data of Step S23 are acquired, the alignment result processing unit 313 of the controller 31 corrects the reticle alignment data acquired in Step S23 to calculate corrected reticle alignment data (Step S81). This calculation is the removal of errors from the reticle alignment data. A preset function is used for the removal of the errors.

Then, the alignment result processing unit 313 calculates reticle alignment residuals (Step S82). The reticle alignment residuals are differences between the corrected reticle alignment data and the reticle alignment data at the respective measurement positions. At the time of the exposure processing, correction is performed on the basis of the reticle alignment residuals. After that, processing proceeds to Step S24.

Further, the same processing as the processing described in Steps S11 to S16 and Steps S27 to S28 is performed on the reticle that is used in the exposure processing. This processing is performed in parallel with the processing of Steps S11 to S16 and the processing of Steps S27 to S28, or is performed before or after the processing of Steps S11 to S16 and the processing of Steps S27 to S28.

Specifically, first, the shape measurement processing unit 314 of the controller 31 gives an instruction to the surface shape measuring unit 20 so that the surface shape measuring unit 20 measures the shape of a reticle used for the exposure of a wafer to be exposed, and the surface shape measuring unit 20 measures the shape of the reticle according to the instruct (Step S91). It is preferable that the number of shape measurement positions is larger than the number of measurement points in the alignment of the reticle. Measurement results are stored in the storage unit 32 as reticle shape data in association with layers (Step S92).

Then, the shape data processing unit 315 of the controller 31 generates topography data (Step S93). Specifically, the shape data processing unit 315 reads reticle shape data that are measured in Step S91 and reticle shape data of the reticle that is used at the time of the preceding exposure processing for the same wafer. Meanwhile, the reticle used at the time of the preceding exposure processing is read out of the storage unit 32. After that, the shape data processing unit 315 takes differences between the reticle shape data, which are measured in this time, and reticle shape data, which are obtained at the time of the preceding processing, at measurement positions to generate topography data. The topography data are represented by a three-dimensional function that includes variables X, Y, and Z.

After that, the shape data processing unit 315 calculates shape change displacements at the respective measurement positions from the topography data (Step S94). Specifically, shape change displacements at a position (X,Y) on the reticle are obtained from the partial differentiation of a function, which represents the topography data, with respect to X and Y. Further, the collection of the shape change displacements at the respective measurement positions on the reticle is shape change displacement data.

Then, the shape data processing unit 315 corrects the shape change displacement data, which are acquired in Step S94, to calculate corrected shape change displacement data (Step S95). This calculation is the removal of errors from the shape change displacement data. A preset function is used for the removal of the errors.

In addition, the shape data processing unit 315 calculates shape change displacement residuals of the reticle (Step S96). The shape change displacement residuals of the reticle are differences between the corrected shape change displacement data and the shape change displacement data at the respective measurement positions. It is preferable that the processing of Steps S91 and S92 of the above-mentioned processing is performed, for example, before the exposure processing for a lot to be exposed.

The processing of Steps S21 to S23 and Steps S81 and S82 is performed in parallel with the processing of Steps S93 to S96.

After that, the fine reticle alignment residual calculating unit 319 of the controller 31 obtains a correlation between the shape change displacement residuals and the reticle alignment residuals and calculates conversion coefficients of the reticle (Step S97). Specifically, the fine reticle alignment residual calculating unit 319 acquires shape change displacement residuals at the measurement positions for reticle alignment residuals. Then, the fine reticle alignment residual calculating unit 319 acquires combinations of the reticle alignment residuals and the shape change displacement residuals at the respective measurement positions for reticle alignment residuals.

After that, the fine reticle alignment residual calculating unit 319 plots the acquired combinations in a coordinate system of which a horizontal axis represents a shape change displacement residual and a vertical axis represents a reticle alignment residual and obtains a correlation. Meanwhile, since the reticle alignment residuals and the shape change displacement residuals are vectors as described above, the fine reticle alignment residual calculating unit 319 resolves each of the reticle alignment residuals and the shape change displacement residuals into an X-direction component and a Y-direction component, obtains a correlation of each component, and calculates the displacement of an approximate straight line that is a conversion coefficient. Meanwhile, when there is a point extremely distant from the approximate straight line, the fine reticle alignment residual calculating unit 319 may remove this point to calculate the displacement of the approximate straight line having a high correlation coefficient. Further, the approximate straight line is obtained here, but is illustrative. The plotted points may be approximated with a non-linear curve, for example, a quadratic curve, a cubic curve, or the like. In this case, the gradient of the non-linear curve at each point of the reticle alignment residuals is a conversion coefficient.

Then, the fine reticle alignment residual calculating unit 319 calibrates the shape change displacement residuals by using conversion coefficients of the reticle and converts the corrected shape change displacement residuals into fine reticle alignment residuals (Step S98). After that, the correction map generating unit 317 of the controller 31 generates a correction map, in which correction values are calculated for every shot, by using the fine wafer alignment residuals and the fine reticle alignment residuals (Step S101). Accordingly, correction values for every shot, which consider high-order distortion in a shot calculated from the shape of the reticle, are calculated.

According to the second embodiment, the shape of a reticle is also previously measured to calculate shape change displacement residuals. The displacement of an approximate straight line between the shape change displacement residuals and the reticle alignment residuals, which are obtained from reticle alignment, is obtained, and the shape change displacement residuals are converted into fine reticle alignment residuals by using the displacement. A correction map in which correction values at the time of exposure processing for every shot are obtained is generated by using the fine wafer alignment residuals and the fine reticle alignment residuals. Then, the exposure unit 10 is corrected by using the correction values of the correction map at the time of exposure processing. Accordingly, an effect of performing correction for every shot, which considers high-order distortion in a shot calculated from the reticle, can be obtained in addition to the effects of the first embodiment.

Meanwhile, the exposure unit 10 using transmitted light has been described by way of example in the above description, but the above-mentioned embodiments can be applied to an exposure unit using reflected light.

Figure 8:
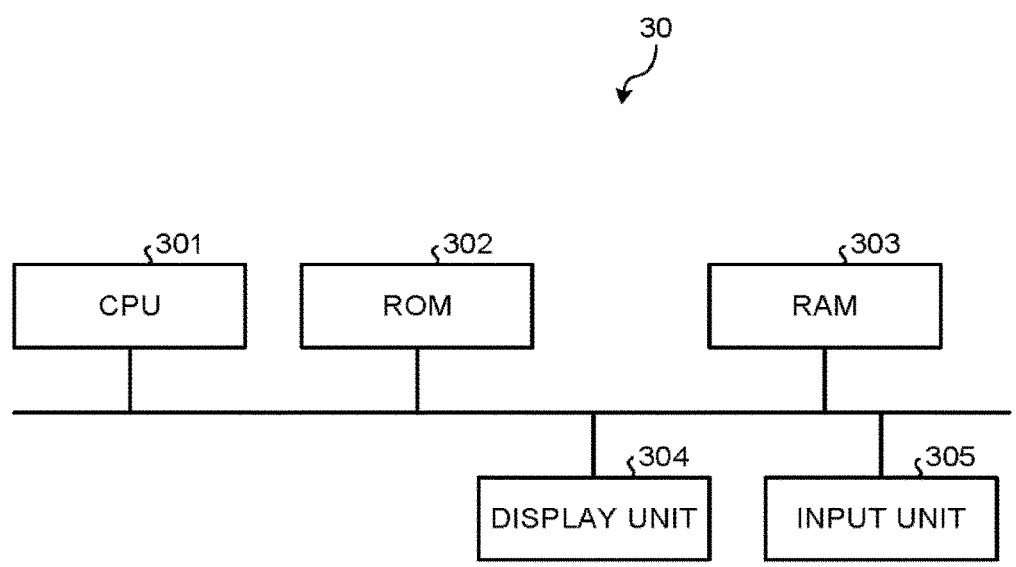
FIG. 8 is a diagram showing the hardware configuration of the control device.

Next, the hardware configuration of the control device 30 will be described. FIG. 8 is a diagram showing the hardware configuration of the control device. The control device 30 comprises a CPU 301, a ROM (Read Only Memory) 302, a RAM (Random Access Memory) 303, a display unit 304, and an input unit 305. In the control device 30, the CPU 301, ROM 302, RAM 303, display unit 304, and input unit 305 are connected via a bus line.

The CPU 301 executes a computer program in which the exposure method is described as described above. The program in which the exposure method is described is a computer program product having a non-transitory computer-readable recording medium containing a plurality of instructions, which can be executed by a computer, for executing the exposure method. The display unit 34 is a display device such as a liquid crystal monitor and displays the wafer shape data, the reticles shape data, the topography data, the wafer alignment residual, the wafer shape change displacement data, the reticle alignment residual and the like according to instructions from the CPU 301. The input unit 305 is constituted by a mouse or a keyboard, and instruction information and the like entered externally by a user is inputted thereto. The instruction information inputted to the input unit 305 is sent to the CPU 301.

The program in which the exposure method is described is stored in the ROM 302 and loaded into the RAM 303 via the bus line.

The CPU 301 executes the program in which the exposure method is described and that is loaded in the RAM 303. Specifically, in the control device 30, according to instructions entered by a user via the input unit 305, the CPU 301 reads out the program from the ROM 302 and loads it in the program storing area in the RAM 303 to perform various processes. The CPU 301 temporarily stores a variety of data produced in the various processes in the data storing area formed in the RAM 303.

The program in which the exposure method is described executed in the control device 30 is configured with modules including the controller 31, and these are loaded onto a main memory and created on the main memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus comprising:
   a surface shape measuring unit that measures the surface shape of an object to be measured;
   an exposure unit that performs exposure on a resist applied to a wafer; and
   a controller that controls the surface shape measuring unit and the exposure unit,
   wherein the controller
      measures the surface shape of the wafer to be subjected to exposure processing by the surface shape measuring unit before the exposure processing,
      performs wafer alignment measurement on the wafer in the exposure unit,
      calculates wafer alignment residuals from results of the wafer alignment measurement,
      calculates shape change displacement residuals from the surface shape of the wafer that is not yet subjected to the exposure processing,
      calculates first conversion coefficients that are ratios of the wafer alignment residuals to the shape change displacement residuals,
      converts the shape change displacement residuals of the wafer into fine wafer alignment residuals by use of the first conversion coefficients to generate fine wafer alignment residual data that are the collection of the fine wafer alignment residuals at measurement positions for the surface shape,
      generates correction information in which first correction values at the time of the exposure processing are calculated for every shot on the wafer by use of the fine wafer alignment residual data, and
      controls exposure processing in the exposure unit by use of the correction information corresponding to the shot of the wafer.

2. The exposure apparatus according to claim 1, wherein the controller is constituted by a CPU having processing capability allowing processing, which is performed from the calculation of the wafer alignment residuals until the generation of the correction information, to be performed between the wafer alignment measurement and the control of the exposure processing.

3. The exposure apparatus according to claim 1, wherein in the calculation of the first conversion coefficients, the controller calculates an approximate curve, which represents a relationship between the shape change displacement residuals and the wafer alignment residuals by a least-squares method, and obtains gradients of the approximate curve at points of the wafer alignment residuals as the first conversion coefficients.

4. The exposure apparatus according to claim 1, wherein in the measurement of the surface shape of the wafer, the measurement of the surface shape of the wafer is performed at points of which the number is larger than the number of measurement points for the wafer alignment measurement.

5. The exposure apparatus according to claim 1, wherein in the calculation of the shape change displacement residuals, the controller
   measures a first surface shape of the wafer on a first layer to be subjected to the exposure processing by the surface shape measuring unit,
   acquires a second surface shape of the wafer on a second layer processed by the preceding exposure processing of the first layer, the second surface shape being a surface shape measured by the surface shape measuring unit at the time of the exposure processing of the second layer,
   calculates topology data from a difference between the first surface shape and the second surface shape,
   calculates surface shape change displacements at the measurement points for the surface shape with the topology data,
   performs correction removing errors from the surface shape change displacements to calculate corrected surface shape change displacements, and
   calculates the shape change displacement residuals that are differences between the surface shape change displacements and the corrected surface shape change displacements.

6. The exposure apparatus according to claim 1, wherein in the calculation of the correction information, the controller subtracts second correction values, which are calculated at the time of immediately preceding exposure processing performed on the wafer, from the calculated first correction values to generate the correction information.

7. The exposure apparatus according to claim 1, wherein the controller
   measures the surface shape of a reticle, which includes a pattern of a layer to be exposed to the wafer, by the surface shape measuring unit before the exposure processing,
   calculates shape change displacement residuals of the reticle, which are obtained before and after the exposure processing, from the surface shape of the reticle that is not yet subjected to the exposure processing,
   calculates second conversion coefficients that are ratios of the wafer alignment residuals to the shape change displacement residuals of the reticle, and
   converts the shape change displacement residuals of the reticle into fine reticle alignment residuals by use of the second conversion coefficients to generate fine reticle alignment residual data that are the collection of the fine reticle alignment residuals at measurement positions for the surface shape, and in the generation of the correction information, the controller generates the correction information in which the first correction values at the time of the exposure processing are calculated for every shot on the wafer by use of the fine reticle alignment residual data in addition to the fine wafer alignment residual data.

8. The exposure apparatus according to claim 1, wherein in the measurement of the surface shape of the wafer, the controller measures the surface shapes of a plurality of the wafers of one lot by the surface shape measuring unit.

9. An exposure method comprising:
measuring the surface shape of a wafer to be subjected to exposure processing before the exposure processing;
performing wafer alignment measurement on the wafer;
calculating wafer alignment residuals from results of the wafer alignment measurement;
calculating shape change displacement residuals from the surface shape of the wafer that is not yet subjected to the exposure processing;
calculating first conversion coefficients that are ratios of the wafer alignment residuals to the shape change displacement residuals;
converting the shape change displacement residuals of the wafer into fine wafer alignment residual data by using the first conversion coefficients and generating fine wafer alignment residual data that are the collection of the fine wafer alignment residuals at measurement positions for the surface shape;
generating correction information in which first correction values at the time of the exposure processing are calculated for every shot on the wafer by using the fine wafer alignment residual data; and
performing the exposure processing by using the correction information corresponding to the shot of the wafer.

10. The exposure method according to claim 9, wherein processing, which is performed from the calculating of the wafer alignment residuals until the generating of the correction information, is performed between the wafer alignment measurement and the exposure processing.

11. The exposure method according to claim 9, wherein in the calculating of the first conversion coefficients, an approximate curve, which represents a relationship between the shape change displacement residuals and the wafer alignment residuals by a least-squares method, is calculated and gradients of the approximate curve at points of the wafer alignment residuals are obtained as the first conversion coefficients.

12. The exposure method according to claim 9, wherein in the measuring of the surface shape of the wafer, the measurement of the surface shape of the wafer is performed at points of which the number is larger than the number of measurement points for the wafer alignment measurement.

13. The exposure method according to claim 9, wherein the calculating of the shape change displacement residuals includes
measuring a first surface shape of the wafer on a first layer to be subjected to the exposure processing,
acquiring a second surface shape of the wafer on a second layer processed by the preceding exposure processing of the first layer, the second surface shape being a surface shape measured at the time of the exposure processing of the second layer,
calculating topology data from a difference between the first surface shape and the second surface shape,
calculating surface shape change displacements at the measurement points of the surface shape with the topology data,
performing correction removing errors from the surface shape change displacements to calculate corrected surface shape change displacements, and
calculating the shape change displacement residuals, which are differences between the surface shape change displacements and the corrected surface shape change displacements.

14. The exposure method according to claim 9, wherein in the calculating of the correction information, second correction values, which are calculated at the time of immediately preceding exposure processing performed on the wafer, are subtracted from the calculated first correction values to generate the correction information.

15. The exposure method according to claim 9, further comprising:
measuring the surface shape of a reticle, which includes a pattern of a layer to be exposed to the wafer, before the exposure processing,
calculating shape change displacement residuals of the reticle, which are obtained before and after the exposure processing, from the surface shape of the reticle that is not yet subjected to the exposure processing,
calculating second conversion coefficients, which are ratios of the wafer alignment residuals to the shape change displacement residuals of the reticle, and
converting the shape change displacement residuals of the reticle into fine reticle alignment residuals by use of the second conversion coefficients to generate fine reticle alignment residual data, which are the collection of the fine reticle alignment residuals at measurement positions for the surface shape, wherein
in the generating of the correction information, the correction information in which the first correction values at the time of the exposure processing are calculated for every shot on the wafer is generated by use of the fine reticle alignment residual data in addition to the fine wafer alignment residual data.

16. The exposure method according to claim 9, wherein in the measuring of the surface shape of the wafer, the surface shapes of a plurality of the wafers of one lot are measured.

17. A method of manufacturing a semiconductor device, the method comprising:
measuring the surface shape of a wafer to be subjected to exposure processing before the exposure processing;
applying a resist to the wafer;
loading the wafer and a reticle on an exposure apparatus;
performing reticle alignment measurement on the reticle;
performing wafer alignment measurement on the wafer;
calculating wafer alignment residuals from results of the wafer alignment measurement;
calculating shape change displacement residuals from the surface shape of the wafer that is not yet subjected to the exposure processing;
calculating first conversion coefficients that are ratios of the wafer alignment residuals to the shape change displacement residuals;
converting the shape change displacement residuals of the wafer into fine wafer alignment residual data by use of the first conversion coefficients to generate fine wafer alignment residual data that are the collection of the fine wafer alignment residuals at measurement positions for the surface shape;

generating correction information in which correction values at the time of the exposure processing are calculated for every shot on the wafer by use of the fine wafer alignment residual data;

performing exposure processing by use of the correction information corresponding to the shot of the wafer; and developing the resist applied to the exposed wafer.

18. The method according to claim 17, wherein processing, which is performed from the calculating of the wafer alignment residuals until the generating of the correction information, is performed between the wafer alignment measurement and the exposure processing.

19. The method according to claim 17, wherein in the calculating of the first conversion coefficients, an approximate curve, which represents a relationship between the shape change displacement residuals and the wafer alignment residuals by a least-squares method, is calculated and gradients of the approximate curve at points of the wafer alignment residuals are obtained as the first conversion coefficients.

20. The method according to claim 17, wherein in the measuring of the surface shape of the wafer, the measurement of the surface shape of the wafer is performed at points of which the number is larger than the number of measurement points for the wafer alignment measurement.

* * * * *